United States Patent [19]

Minakuchi

[11] 4,318,012
[45] Mar. 2, 1982

[54] INPUT SIGNAL PROCESSING CIRCUIT FORMED AS AN INTEGRATED CIRCUIT

[75] Inventor: Hiroshi Minakuchi, Shiga, Japan

[73] Assignee: Matsushita Electric Industrial Co., Ltd., Osaka, Japan

[21] Appl. No.: 47,950

[22] Filed: Jun. 12, 1979

[51] Int. Cl.³ .............................................. H03K 5/24
[52] U.S. Cl. .................................. 307/360; 307/271; 328/48; 328/71; 328/147
[58] Field of Search ............... 307/355, 356, 360, 362, 307/271; 328/25, 48, 46, 71, 104, 154, 146, 147

[56] References Cited

U.S. PATENT DOCUMENTS 3,675,045  7/1972  Mullaly ............................... 307/362
4,121,122  10/1978  Pokrandt ............................ 307/362

Primary Examiner—John Zazworsky
Attorney, Agent, or Firm—Stevens, Davis, Miller & Mosher

[57] ABSTRACT

An input signal processing circuit formed as an integrated circuit is provided with power supply terminals of plus and minus potentials, a voltage dividing terminal connected to a voltage dividing point between the power supply terminals, and an input terminal applied thereto with an external operation signal. A discriminator circuit is included in the input signal processing circuit to determine whether a signal potential applied to the input terminal is above or below the divided voltage potential and to switch over an operating state of a circuit block contained within the input signal processing circuit to another operating state depending on the results of the determination.

8 Claims, 4 Drawing Figures

INPUT SIGNAL PROCESSING CIRCUIT FORMED AS AN INTEGRATED CIRCUIT

BACKGROUND OF THE INVENTION

The present invention relates to an input signal processing circuit formed as an integrated circuit.

Heretofore, when a program signal is externally supplied to a programmable frequency divider incorporated in an integrated circuit, an arrangement is adopted wherein a command in a binary code, including an "H" level or "L" level is applied to the program terminal of the integrated circuit. In this case, when only one program terminal is provided, more than two numerical values "0" and "1" can not be input to the integrated circuit. In the case where two program terminals are provided, four kinds of numerical values of "0", "1", "2" and "3" are allowed to be supplied to the programmable frequency divider. In order to use one hundred kinds of numerical values, seven program terminals are required.

SUMMARY OF THE INVENTION

An object of the present invention is to provide an input signal processing circuit formed as an integrated circuit having input terminals supplied with external operation signals in which the number of required terminals is decreased to reduce the number of connection lines connected to external circuits thereby enabling information or data to be available at the input terminals in a simplified circuit configuration.

Heretofore, when three types of frequency dividers each having a fixed divisor factor are to be switched among for example, it has been necessary to provide two terminals to effect the desired switch-over.

Another object of the invention is to eliminate the drawbacks of the hitherto known input signal processing circuit formed as an integrated circuit and to provide an improved input signal processing circuit in which the number of required terminals is significantly reduced by making more data or information available at the input terminals.

DESCRIPTION OF THE PREFERRED EMBODIMENTS

Figure 1:
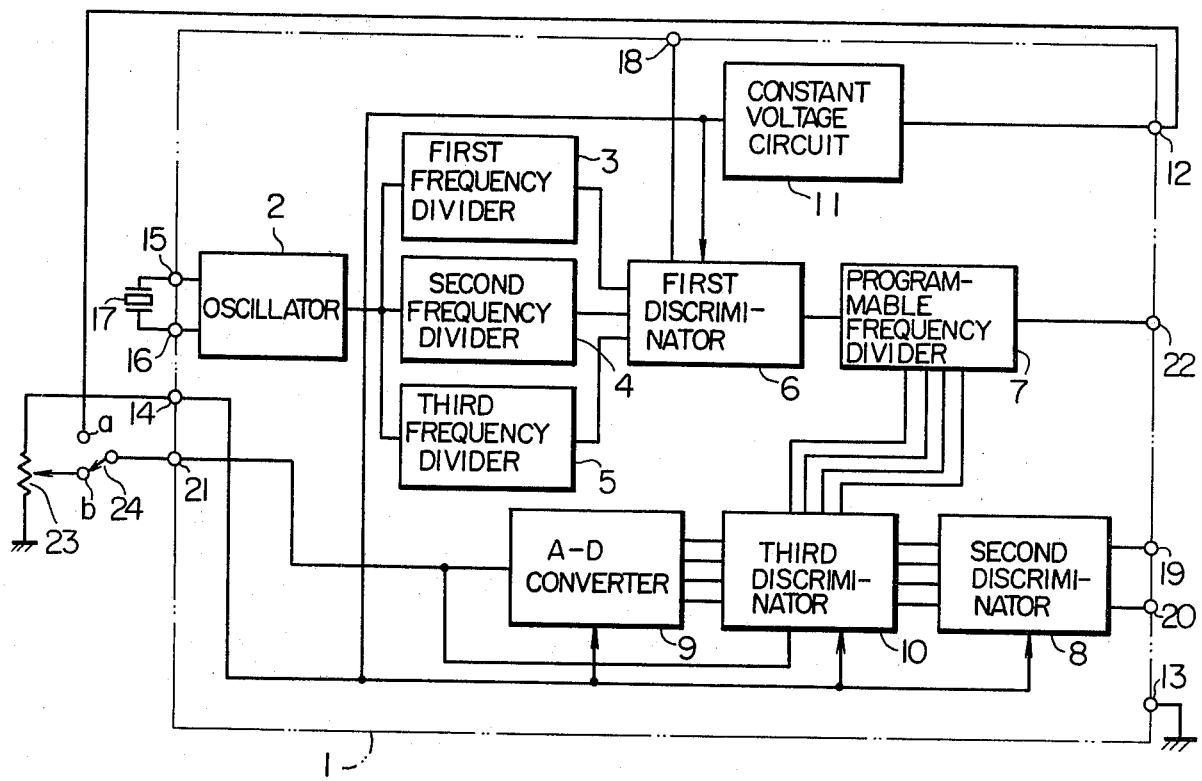
FIG. 1 is a block diagram showing an input signal processing circuit formed as an integrated circuit according to an embodiment of the invention.

Referring to FIG. 1 which shows in a block diagram a typical arrangement of an input signal processing circuit formed as an integrated circuit according to an exemplary embodiment of the invention, the input signal processing circuit generally indicated by reference numeral 1 comprises as internal components thereof an oscillator circuit 2, a first frequency divider having a divisor factor of ten and adapted to be supplied with the output frequency signal from the oscillator 2, a second frequency divider 4 having a divisor factor of twenty, a third frequency divider 5 having a divisor of twenty seven, a first discriminator circuit 6 supplied with outputs from the three frequency dividers 3, 4 and 5, a programmable frequency divider 7 supplied with the output from the discriminator circuit 6, a second discriminator circuit 8 and an analog-to-digital (A-D) converter 9 for producing program signals supplied to the programmable frequency divider 7, a third discriminator circuit 10 for selecting the output signal from the discriminator circuit 8 and the A-D converter 9 thereby to transfer the selected output to the programmable frequency divider 7, and a constant voltage source circuit 11 for feeding a constant voltage to the discriminator circuits 6, 8, 10 and A-D converter 9.

Further, in FIG. 1, reference numeral 12 denotes a power supply terminal of high or plus (+) potential, 13 denotes a power supply terminal of low or minus (−) potential, 14 denotes a constant voltage output terminal, 15 and 16 denote terminals for connecting a quartz oscillator element 17, 18 denotes an input terminal of the first discriminator circuit 6, 19 and 20 denote input terminals of the second discriminator circuit 8, 21 denotes a terminal for supplying an analog input voltage to the A-D converter and at the same time serving as the input terminal of the third discriminator circuit 10, and numeral 22 denotes an output terminal for a frequency-divided output signal.

The input signal processing circuit 1 shown in FIG. 1 may be employed as a frequency synthesizer which is adapted to produce a reference frequency signal for controlling a rotating speed of a rotating body such as a driven rotor of an electric motor. The output from the oscillator circuit 2 is applied to the frequency dividers 3, 4 and 5. One of the outputs from these frequency dividers 3, 4 and 5 is applied to the programmable frequency divider 7 under the control of the discriminator circuit 6 in dependence on whether the potential applied to the input terminal 18 is at the highest potential level, i.e. the potential level in approximation to the one prevailing at the power supply terminal 12 of plus potential or at the lowest potential, i.e. the potential level in approximation to the potential at the power supply terminal 13 of minus potential or at a divided intermediate potential, i.e. the potential level in approximation to the one prevailing at the constant voltage output terminal 14.

For example, assuming that the input signal processing circuit is employed for controlling the rotation of a turn table of a record player, the ratio between the frequencies output from the frequency dividers 4 and 5 may be selected to correspond to the ratio between revolution numbers of 45 r.p.m and 33⅓ r.p.m.. Accordingly, the frequency dividers 4 and 5 may be switched over to each other in dependence on the type of a record disc to be played. In the case where the input signal processing circuit 1 is to be used for controlling the rotating speed of a capstan in a tape recorder, the frequency dividers 3 and 4 may be switched over to each other in dependence on the speed switch-over between 9.5 cm/sec and 4.75 cm/sec or between 38 cm/sec and 19 cm/sec.

On the other hand, the terminals 19 and 20 are connected to one of the terminals 12, 13 and 14 as required, the selected combination of which is converted into a corresponding binary code through the discriminator circuit 8 to be applied to the third discriminator circuit 10, while the analog voltage applied to the terminal 21, i.e. the voltage available through a variable resistor 23 is converted into a binary code signal through analog-to-digital conversion and applied to the third discriminator circuit 10.

The third discriminator circuit 10 is adapted to select either the output signal from the A-D converter 9 or the output signal from the second discriminator circuit 8 in dependence on whether the potential applied to the terminal 21 is higher or lower than the potential at the terminal 14 thereby to supply the selected output signal to the programming terminal of the programmable frequency divider 7. More specifically, when a movable contact of a change-over switch 24 is closed to a stationary contact a, i.e. when the terminal 21 is supplied with high or plus potential, the output signal from the discriminator circuit 8 is applied to the programmable frequency divider 7. On the other hand, when the movable contact of the change-over switch 24 is closed to a stationary contact b, the output signal from the A-D converter 9 is applied to the programmable frequency divider 7.

It is mentioned here that the programmable frequency divider 7 is provided for realizing a fine adjustment of the output frequency, wherein fine adjustment is selectively effected either by means of the variable resistor 23 or through appropriate connections of the terminals 19 and 20.

Figure 2:
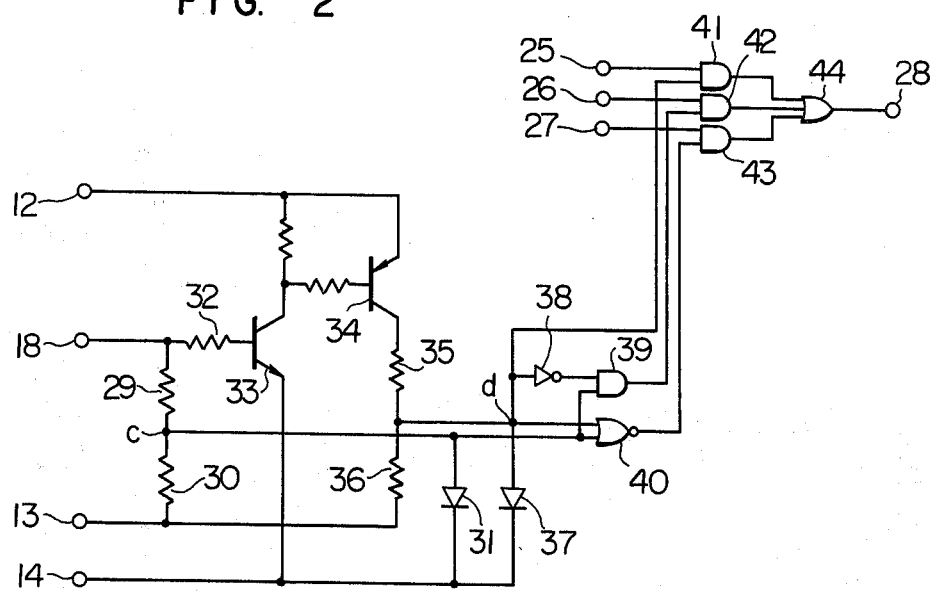
FIG. 2 is a schematic circuit diagram showing an exemplary arrangement of a first discriminator circuit employed in the input signal processing circuit shown in FIG. 1.

Now, referring to FIG. 2 which shows an exemplary circuit arrangement of the first discriminator circuit 6, the terminals 12, 13, 14 and 18 correspond to those shown in FIG. 1, while terminals 25, 26 and 27 are supplied with output signals from the frequency dividers 3, 4 and 5, respectively, and a terminal 28 is provided at the input side of the programmable frequency divider 7.

Referring to FIG. 2, when the potential applied to the input terminal 18 is at the highest level, i.e. when the input terminal 18 is short-circuited to the power supply terminal 12 of plus potential, a current will flow through resistors 29 and 30 and a diode 31, as the result of which a base current will flow to a transistor 33 through a resistor 32 and hence also to a transistor 34, which in turn gives rise to a collector current of the transistor 34 through resistors 35 and 36 and a diode 37. In this manner, potentials at circuit points c and d become higher than the potential at the terminal 14 by forward voltage drops at the diodes 31 and 37, respectively.

Assuming that all of inverter 38, an AND gate 39, a NOR gate 40, AND gates 41, 42 and 43, and an OR gate 44 are supplied with power from the terminals 13 and 14, the potential levels at the circuit points c and d are both high or "H" level, resulting in that the output levels of both the AND gate 39 and the NOR gate 40 will become low or "L" level. In this case, the signal applied to the terminal 25, i.e. the output signal from the frequency divider 3 is transmitted to the terminal 28, that is, the input side of the programmable frequency divider 7 through the AND gate 41 and OR gate 44.

Next, assuming that the potential applied to the input terminal 18 is equal to the divided potential due to the short-circuit produced between the input terminal 18 and the constant voltage output terminal (voltage dividing terminal) 14, no current will flow through the transistors 33 and 34 as well as the diodes 31 and 37, as a result of which potential at the circuit point d becomes low level "L", while the potential at the circuit point c will become high "H", provided that the resistance value of the resistor 30 is selected sufficiently greater than that of the resistor 29. Under these conditions, the output of the AND gate 39 is high or "H" with the output level of the NOR gate 40 being "L", whereby the signal applied to the terminal 26, i.e. the output signal from the frequency divider 4 is transferred to the terminal 28 provided at the input side of the programmable frequency divider 7 through the AND gate 42 and the OR gate 44.

On the other hand, when the potential applied to the input terminal 18 is at the lowest level which means that the input terminal 18 is short-circuited to the power supply terminal 13 of low or minus potential, the potential levels at both the circuit points c and d will become "L" level, resulting in the output of "L" level from the AND gate 39 and the output of "H" level from the NOR gate 40. Under these conditions, the signal applied to the terminal 27, i.e. the output signal from the frequency divider 5 is transmitted to the terminal 28 provided at the input side of the programmable frequency divider 7 through the AND gate 43 and the OR gate 44.

Figure 3:
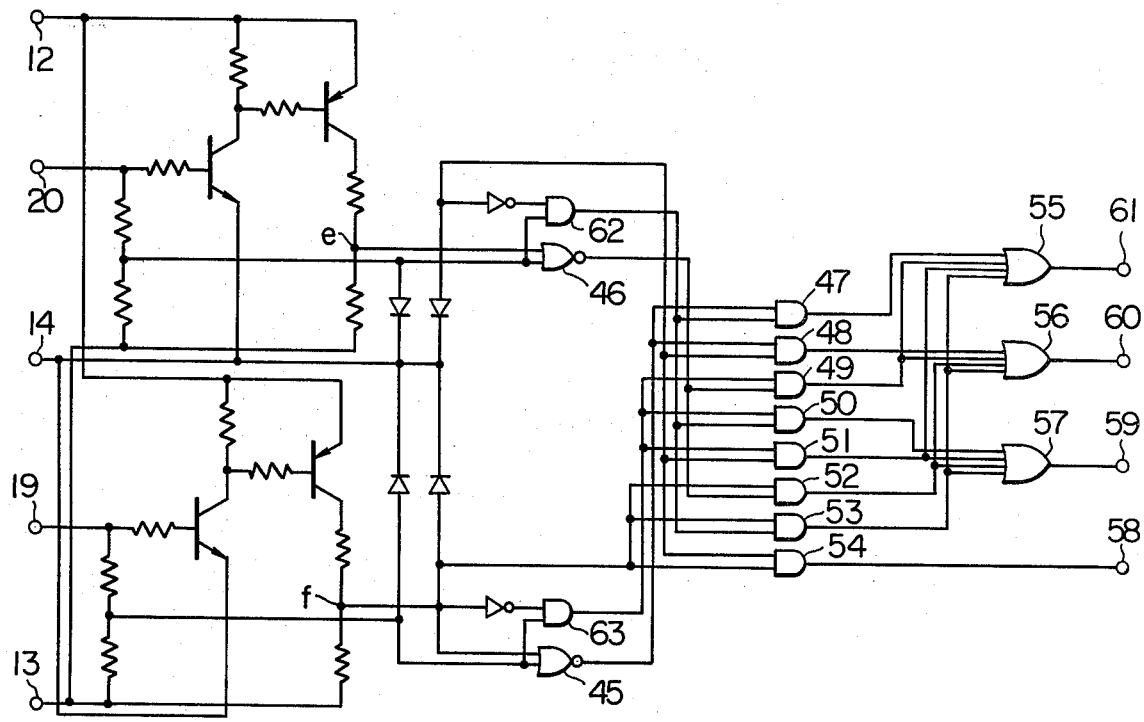
FIG. 3 is a schematic circuit diagram showing an exemplary arrangement of a second discriminator circuit.

The second discriminator circuit 8 included in the input processing circuit 1 shown in FIG. 1 is adapted to prepare eight kinds of binary codes in dependence on the signal levels applied to the input terminals 19 and 20 thereof. FIG. 3 shows a typical circuit arrangement of the discriminator circuit 8. For simplification of description, the highest potential applied to the input terminals 19 and 20 shown in FIG. 3 is represented by "H", while the divided potential applied to these terminals 12 and 20 is identified by "M" and the lowest potential or the open-circuit potential is represented by "L" in the following description.

When the input terminals 19 and 20 are applied with "L" potentials, the outputs from NOR gates 45 and 46 will become "H" level. However, since the output levels of AND gates 47, 48, 49, 50, 51, 52, 53 and 54 as well as the output levels of OR gates 55, 56 and 57 have all been at "L" level, the potentials at terminals 58, 59, 69 and 61 will be then at "L" level.

When potentials of "L" and "M" levels are applied to the input terminals 19 and 20, the output levels from the NOR gate 45 and AND gate 62 will become "H", resulting in the output level of "H" from the AND gate 47. Then, the binary output code appearing at the output terminals 58, 59, 60 and 61 is expressed as "L, L, L, H".

Upon application of the potential levels "L" and "H" at the input terminals 19 and 20, both the output potential from the NOR gate 45 and the potential at the circuit point e become "H", resulting in "L" level output from the AND gate 48. Thus, the output code is expressed by "L, L, H. L".

Now, assuming that the potentials "M" and "L" are applied to the input terminals 19 and 20, both of the outputs from AND gate 63 and the NOR gate 46 become "H" level, resulting in the output of "H" level from the AND gate 49 as accompanied by "H" outputs from the OR gates 55 and 56. Thus, the output code corresponds to "L, L, H, H".

Application of the potentials "M" and "M" to the input terminals 19 and 20 brings about outputs of "H" level from AND gates 63 and 62 which are accompanied by "H" outputs from the AND gate 50 and the OR gate 57. Thus, the output code is represented by "L, H, L, L".

Application of "M" and "H" potentials at the input terminals 19 and 20 brings about "H" levels at both the output of AND gate 63 and the circuit point e, involving "H" level at the outputs of the AND gate 51 as well as the OR gates 57 and 55. The output code then corresponds to "L, H, L, H".

When the input terminals 19 and 20 are supplied with potentials "H" and "L", the potential level at the circuit point f and the output of the NOR gate 46 become both "H", as the result of which the output levels of the AND gate 52 and the OR gates 56 and 57 become also "H", thereby to produce the output code "L, H, H, L".

Upon application of "H" and "M" potentials at the input terminals 19 and 20, the potential levels at the circuit point f and the output of the AND gate 52 both become "H", whereby the outputs from the AND gate 53, OR gates 55, 56 and 57 become all "H". Thus, the output code corresponds to "L, H, H, H".

Finally, when potentials of level "H" are applied to both the input terminals 19 and 20, the potential levels at the circuit points e and f become "H" with the output from the AND gate 54 being also at "H", whereby the output code of "H, L, L, L" is produced.

In this manner, the discriminator circuit shown in FIG. 3 serves to convert ternary input codes into binary codes as summarized in the following table.

| Decimal Representation | Input Code | | | Binary Output | | | |
| --- | --- | --- | --- | --- | --- | --- | --- |
| 0 | L | L | L | L | L | L |
| 1 | L | M | L | L | L | H |
| 2 | L | H | L | L | H | L |
| 3 | M | L | L | L | H | H |
| 4 | M | M | L | H | L | L |
| 5 | M | H | L | H | L | H |
| 6 | H | L | L | H | H | L |
| 7 | H | M | L | H | H | H |
| 8 | H | H | H | L | L | L |

Figure 4:
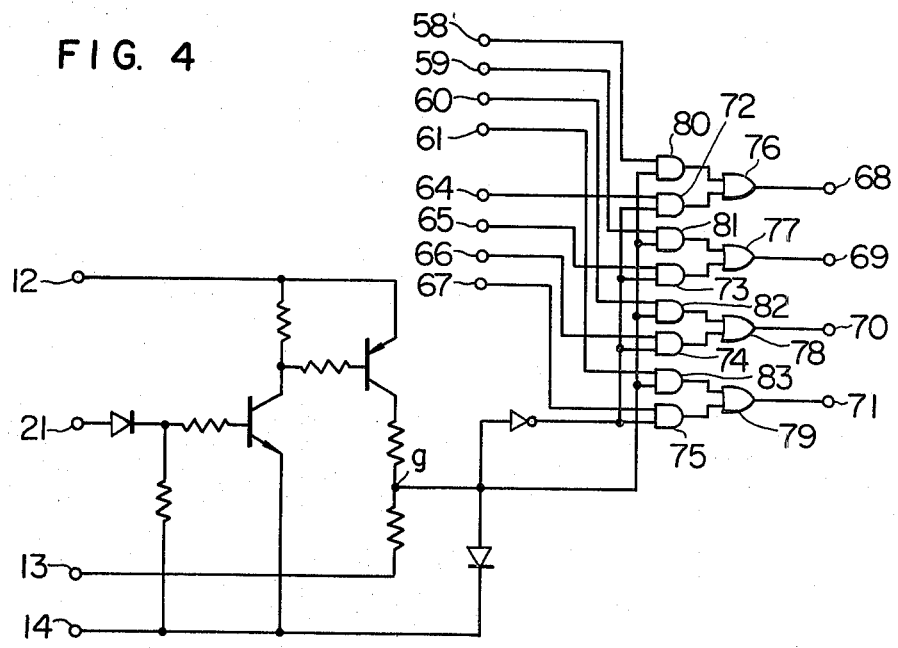
FIG. 4 is a schematic circuit diagram showing an exemplary arrangement of a third discriminator circuit employed in the input signal processing circuit shown in FIG. 1.

FIG. 4 shows an examplary circuit arrangement of the third discriminator circuit 10 shown in FIG. 4 which has terminals 58, 59, 60 and 61 adapted to be supplied with the output code from the second discriminator circuit 8, terminals 64, 65, 66 and 67 supplied with the output signal from the A-D converter 9 and output terminals 68, 69, 70 and 71 at which output signal of the third discriminator circuit is produced to be applied to the program terminal of the programmable frequency divider 7.

Referring to FIG. 1, when the movable contact of the change-over switch 24 is closed to the stationary contact b, the potential level at a circuit point g of the circuit shown in FIG. 4 is "L", allowing the output from the A-D converter 9 to be transmitted to the output terminals 68, 69, 70 and 71 through AND gates 72, 73, 74 and 75 as well as OR gates 76, 77, 78 and 79, whereby the programmable frequency divider 7 is programmed by the output signal from the A-D converter 9.

On the other hand, when the movable contact of the change-over switch 24 is closed to the stationary contact a, the potential level at the circuit point g shown in FIG. 4 becomes "H", thereby to allow the output from the second discriminator circuit 8 to be transmitted to the output terminals 68, 69, 70 and 71 through AND gates 80, 81, 82 and 83 as well as the OR gates 76, 77, 78 and 79. Thus, the programmable frequency divider 7 is programmed by the output signal from the second discriminator circuit 8.

Now, assuming that the functions of the input signal processing circuit are to be implemented in accordance with the prior art techniques, there will be required two terminals for switching over the frequency dividers 3, 4 and 5 among one another, four terminals for producing eight kinds of program codes supplied to the programmable frequency divider 7 in a form of binary codes, and additionally one terminal for selecting one of the output from the A-D converter 9 and binary program code supplied externally, thereby to supply the selected signal to the programmable frequency divider 7. Thus, four extra terminals would have to be employed as compared with the input signal processing circuit according to the invention such as shown in FIG. 1. In other words, the input signal processing circuit implemented according to the teaching of the invention allows a significant advantageous decrease in the number of required terminals as compared with the hitherto known input signal processing circuit formed as an integrated circuit.

In the case of the exemplary embodiment shown in FIG. 1, three different kinds of discriminator circuits are concurrently employed. However, it will be appreciated that these discriminators may be employed individually. Further, the constant voltage output terminal 14 may be replaced by a divided voltage terminal 14. Besides, the voltage dividing circuit as well as the constant voltage supplying circuit may be incorporated in the integrated circuit or implemented separately to the same effect.

Although the description has been directed to the input signal processing circuit including a digital circuit as a main component, it is self-explanatory that the invention can be equally applied to input signal processing circuits in which an analog circuit constitutes a main part.

As will be appreciated from the foregoing description, the invention provides an input signal processing circuit formed as an integrated circuit which has power supply terminals of plus potential and minus potential, a divided voltage terminal, and an input terminal supplied with an external operation signal and which includes discriminator circuit means for determining selectively the operating state of the integrated circuit by discriminating whether the signal potential applied to the input terminal is higher or lower than a divided voltage level, whereby the number of the terminals required for the integrated circuit can be significantly reduced as compared with the prior art circuit, while the integrated circuit can be implemented in a simplified structure of a reduced size.

I claim:

1. An input signal processing circuit formed as an integrated circuit comprising:
a first power supply terminal for receiving a first potential,
a second power supply terminal for receiving a second potential lower than said first potential,
a divided voltage terminal receiving a divided voltage at a level between the potential limits received by said first and second power supply terminals,
an input terminal for receiving an external command signal in the form of one of (1) an analog signal having a potential level varying in a level range between the potential level received by said divided voltage terminal and the potential level received by one of said power supply terminals and (2) a D.C. potential signal of a level substantially at the potential level received by the other one of said power supply terminals, discriminator circuit means connected to said input terminal for determining whether a signal potential of said external command signal applied to said input terminal is at least higher or lower than a divided voltage potential received by said divided voltage terminal to thereby determine whether said analog signal or D.C. potential signal has been applied to said input terminal, an A-D converter for converting an analog signal applied to said input terminal into a digital signal, a program source for providing a digital program signal, and a programmable frequency divider adapted to be selectively programmed either by an output from said A-D converter or by an output of said program source in accordance with the output of said discriminator circuit means, such that upon application of a potential outside the level range of said analog signal to said input terminal, said programmable frequency divider is supplied with a program from said program source and upon application of a potential within the level range of said analog signal said programmable frequency divider is supplied with the output of said A-D converter.

2. An input signal processing circuit as set forth in claim 1, wherein said divided voltage terminal is connected to an output line of an internal constant voltage circuit, an output from said constant voltage circuit being supplied to said A-D converter.

3. An input signal processing circuit formed as an integrated circuit comprising:

a divided voltage terminal receiving a divided voltage which is used as a reference voltage to determine the level of an input signal, an input terminal for receiving an external command signal, an internal circuit having at least three operating states, and, discriminator circuit means connected to said input terminal to determine whether a signal potential of an external command signal applied to said input terminal is at an "H" level indicating that the input signal potential is higher than said divided voltage, or at an "M" level indicating the input signal potential is substantially equal to said divided voltage, or at an "L" level indicating the input signal potential is lower than said divided voltage, said discriminator circuit means switching the operating state of said internal circuit to one of said three different operating states in accordance with whether an "H", "M", or "L" level signal is applied to said input terminal.

4. An input signal processing circuit as set forth in claim 3, wherein said divided voltage terminal is connected to an output line of an internal constant voltage circuit.

5. An input signal processing circuit as set forth in claim 3, wherein said internal circuit comprises first, second, and third circuit blocks and said discriminator circuit means selects one of the outputs from said circuit blocks in accordance with whether said external command signal applied to said input terminal is at an "H", "M", or "L" level, said discriminator circuit means supplying the output signal of the selected circuit block to a fourth circuit.

6. An input signal processing circuit as set forth in claim 5, wherein said first, second and third circuit blocks are respectively first, second and third frequency dividers commonly connected to an oscillator circuit, and wherein said fourth circuit is a programmable frequency divider so that said discriminator circuit means responds to whichever of the "H", "M", and "L" levels is applied to said input terminal to correspondingly switch the outputs produced from one of the first, second and third frequency dividers to said programmable frequency divider.

7. An input signal processing circuit as set forth in claim 5, wherein said fourth circuit is programmable and further comprising an additional discriminator circuit means for receiving from additional input terminals command signals including a combination of potentials of said "H", "M" and "L" levels, said additional discriminator circuit means converting said command signals into corresponding binary codes, and means for selectively programming said fourth circuit with said binary codes.

8. An input signal processing circuit according to claim 7 wherein said fourth circuit is a programmable frequency divider.

* * * * *